United States Patent
Wang

(10) Patent No.: US 10,804,405 B2
(45) Date of Patent: Oct. 13, 2020

(54) METHOD FOR MAKING THIN FILM TRANSISTOR, THIN FILM TRANSISTOR, BACK PLATE AND DISPLAY DEVICE

(71) Applicant: BOE TECHNOLOGY GROUP CO., LTD., Beijing (CN)

(72) Inventor: Zhi Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/335,081

(22) PCT Filed: Aug. 9, 2018

(86) PCT No.: PCT/CN2018/099527
§ 371 (c)(1),
(2) Date: Mar. 20, 2019

(87) PCT Pub. No.: WO2019/052290
PCT Pub. Date: Mar. 21, 2019

(65) Prior Publication Data
US 2019/0214501 A1    Jul. 11, 2019

(30) Foreign Application Priority Data
Sep. 15, 2017 (CN) .......................... 2017 1 0840881

(51) Int. Cl.
*H01L 29/786* (2006.01)
*H01L 29/66* (2006.01)
(Continued)

(52) U.S. Cl.
CPC .. *H01L 29/78609* (2013.01); *H01L 21/02532* (2013.01); *H01L 21/02592* (2013.01);
(Continued)

(58) Field of Classification Search
CPC ......... H01L 21/02532; H01L 21/02592; H01L 21/02595; H01L 21/02675;
(Continued)

(56) References Cited

U.S. PATENT DOCUMENTS

2005/0139923 A1    6/2005  Kwon et al.
2005/0218403 A1*  10/2005  Kuo .................. H01L 29/78678
                                                          257/59
(Continued)

FOREIGN PATENT DOCUMENTS

CN    102468232 A    5/2012
CN    105789327 A    7/2016
CN    107482065 A    12/2017

OTHER PUBLICATIONS

International Search Report and Written Opinion for Application No. PCT/CN2018/099527, dated Nov. 13, 2018, 10 Pages.

*Primary Examiner* — Stephen W Smoot
(74) *Attorney, Agent, or Firm* — Brooks Kushman P.C.

(57) ABSTRACT

The present disclosure provides a method for making a thin film transistor (TFT), a TFT, a back plate and a display device. The TFT includes: a gate electrode, a source, a drain, a dielectric layer and an active layer on the dielectric layer. The active layer includes at least one a-Si area and at least one p-Si area. This can reduce leakage current and reduce the technical complexity of the large-channel TFT.

19 Claims, 4 Drawing Sheets

(51) Int. Cl.
*H01L 21/02* (2006.01)
*H01L 27/32* (2006.01)

(52) U.S. Cl.
CPC .. *H01L 21/02595* (2013.01); *H01L 21/02678* (2013.01); *H01L 29/66757* (2013.01); *H01L 29/66765* (2013.01); *H01L 29/78666* (2013.01); *H01L 29/78669* (2013.01); *H01L 29/78675* (2013.01); *H01L 29/78678* (2013.01); *H01L 29/78696* (2013.01); *H01L 27/3244* (2013.01)

(58) Field of Classification Search
CPC ........... H01L 21/02678; H01L 27/3244; H01L 29/6675; H01L 29/66765; H01L 29/78609; H01L 29/78666; H01L 29/78669; H01L 29/78675; H01L 29/78678; H01L 29/78696

See application file for complete search history.

(56) References Cited

U.S. PATENT DOCUMENTS

| | | | |
|---|---|---|---|
| 2008/0135847 A1* | 6/2008 | Jung | H01L 29/78696 257/59 |
| 2012/0107983 A1 | 5/2012 | Choi | |
| 2017/0125606 A1* | 5/2017 | Nunan | H01L 21/268 |

\* cited by examiner

--Prior Art--

METHOD FOR MAKING THIN FILM TRANSISTOR, THIN FILM TRANSISTOR, BACK PLATE AND DISPLAY DEVICE

CROSS-REFERENCE TO RELATED APPLICATION APPLICATIONS

This application is the U.S. national phase of PCT Application No. PCT/CN2018/099527 filed on Aug. 9, 2018, which claims priority to Chinese Patent Application No. 201710840881.1 filed on Sep. 15, 2017, which are incorporated herein by reference in their entireties.

TECHNICAL FIELD

The present disclosure relates to display technologies, and more particularly, to a method for making a thin film transistor (TFT), a TFT, a back plate and a display device.

BACKGROUND

During the production process of an active matrix organic light Emitting diode (AMOLED) back plate based on Micro-Lens Array (MLA), the structure of a thin film transistor (TFT) includes a gate metal layer, a gate insulation (GI) layer, which is set on the gate metal layer and a p-Si layer, which is set on the layer. Because the p-Si has large mobility and less defects, even in an off state, electrons can easily go through the channel, resulting in large leakage current. In order to reduce the leakage current, after forming a p-Si and SiO2 island, a-Si layer may be deposited on the p-Si and SiO2 island and then subsequent production is performed. Therefore, one more step for making the a-Si layer is needed, which increases the technological complexity.

Generally, the p-Si layer is made by using an MLA regional laser annealing technology, and high position accuracy laser annealing is selectively performed for the a-Si in the TFT channel area using a laser source beam via the MLA mask to form the p-Si. This technology is also called Partial Laser Anneal Silicon (PLAS) or Selective Laser-Annealing (SLA). The mobility rate of the TFT made by using this technology is 5-20 cm2/V·s, which is 10-50 times of that of the a-Si and may satisfy back plate requirements of AMOLED. However, due to hardware limitation of the laser and light path hardware, effective spot length of the laser is about 1000 micrometers, that is the effective channel length of the made TFT is 1000 micrometers. However, for design requirements of Gate driver On Array (GOA) of the AMOLED back plate, large channel TFT, length of which is larger than 1500 micrometers, is needed. Therefore, due to limitation of effective spot length of the laser, it is difficult to achieve mass production.

It can be seen that as for current MLA-based AMOLED back plate, the made TFT has high leakage current. In order to reduce the leakage current, another a-Si layer is needed, which increases the technical complexity. Meanwhile, due to limitation of effective spot length of the laser, the technical complexity of the large-channel TFT is relatively high.

SUMMARY

According to a first aspect, an embodiment of the present disclosure provides thin film transistor (TFT) that includes: a gate electrode; a source; a drain; a dielectric layer; and an active layer on the dielectric layer. The active layer includes at least one a-Si area and at least one p-Si area.

Optionally, the active layer includes one a-Si area and the a-Si area is at a center of the active layer.

Optionally, the active layer includes at least two a-Si areas and the a-Si areas are symmetrically set in relative to a central axis between the source and the drain.

Optionally, each a-Si area and each p-Si area in the active layer are set in series.

Optionally, the active layer includes: 2 or 4 a-Si areas and 3 p-Si areas; or, the active layer includes: 4 or 6 a-Si areas and 5 p-Si areas.

Optionally, the dielectric layer is a gate insulating layer; the TFT further includes: a silicon oxide layer on the active layer; and a heavily-doped amorphous silicon layer between the silicon oxide layer and each of the source and the drain.

Optionally, the dielectric layer is a buffer layer; the TFT further includes: a silicon oxide layer on the active layer; and a dielectric layer on the gate electrode and between the silicon oxide layer and each of the source and the drain.

Optionally, a length of each side of each p-Si area is in a range of from 2 micrometers to 1000 micrometers; and a length of each side of each a-Si area is larger than or equal to 2 micrometers.

According to a second aspect, an embodiment of the present disclosure further provides a method for making a Thin Film Transistor (TFT), which includes: making an a-Si layer on a dielectric layer; and performing laser radiation on one or multiple positions of the a-Si layer to form a p-Si area and retaining at least one a-Si area, which is not radiated by laser.

Optionally, one a-Si area, which is not radiated by laser, is retained at a center of an active layer.

Optionally, at least two a-Si areas, which are not radiated by laser, are retained and symmetrically set in relative to a central axis between a source and a drain.

Optionally, each a-Si area and each p-Si area in an active layer are set in series.

Optionally, the performing laser radiation on one or multiple positions of the a-Si layer to form a p-Si area and retaining at least one a-Si area, which is not radiated by laser, includes: performing the laser radiation on 3 positions of the a-Si layer to form the p-Si areas and retaining 2 or 4 a-Si areas, which are not radiated by the laser, or, performing the laser radiation on 5 positions of the a-Si layer to form the p-Si areas and retaining 4 or 6 a-Si areas, which are not radiated by the laser.

Optionally, when the dielectric layer is a gate insulating layer, after the performing laser radiation on one or multiple positions of the a-Si layer to form a p-Si area and retaining at least one a-Si area, which is not radiated by laser, the method further includes: making a silicon oxide layer; and directly making a heavily-doped amorphous silicon layer on the silicon oxide layer.

Optionally, a length of each side of each p-Si area is in a range of from 2 micrometers to 1000 micrometers; and a length of each side of each a-Si area is larger than or equal to 2 micrometers.

According to a third aspect, an embodiment of the present disclosure further provides a back plate, including the TFT mentioned in the first aspect.

According to a fourth aspect, an embodiment of the present disclosure further provides a display device, including the TFT mentioned in the first aspect.

BRIEF DESCRIPTION OF THE DRAWINGS

By reading detailed description of non-restrictive embodiments, which are made referring to the following drawings, other features, objectives and merits of the present disclosure will be more apparent.

DETAILED DESCRIPTION

Figure 1:
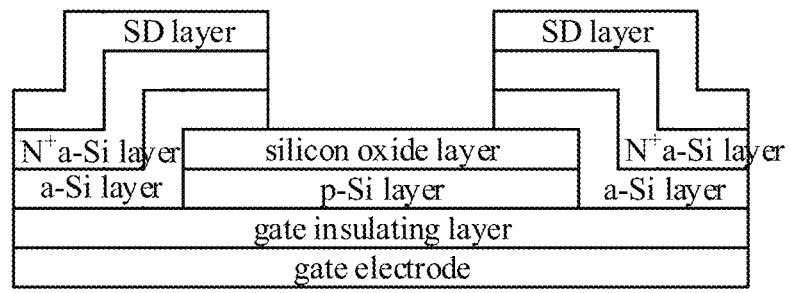
FIG. 1 is a diagram illustrating a cross section of structure of a TFT in the related art.

Further details of this disclosure are given below in conjunction with the drawings and embodiments. It should be understood that the specific embodiments described herein are used only to explain the disclosure and are not limited to the disclosure. It is also noted that, for ease of description, only those portions related to the disclosure are shown in the drawings.

It should be noted that, without conflict, the embodiments and features in the embodiments of this disclosure may be combined with each other. The accompanying drawings and embodiments be referred to below to explain this disclosure in detail.

FIG. 1 is a diagram illustrating a cross section of structure of a TFT in the related art. The TFT includes: a gate metal layer, a gate insulating (GI) layer set on the gate metal layer and a p-Si layer set on the GI layer.

Figure 2:
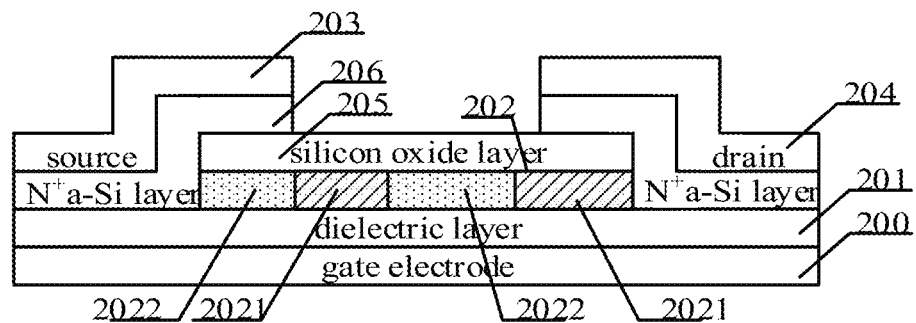
FIG. 2 is a diagram illustrating a cross section of structure of a TFT in accordance with embodiments of the present disclosure.

Referring to FIG. 2, FIG. 2 is a diagram illustrating a TFT in accordance with embodiments of the present disclosure. The TFT includes: a gate electrode 200, a source 203, a drain 204, a dielectric layer 201 and an active layer 202 set on the dielectric layer 201. The active layer 202 includes at least one a-Si area 2021 and at least one p-Si area 2022.

In the active layer 202 of the TFT, the p-Si has large mobility rate and less defects, while the a-Si has many defects, strong resistance to electrons and large resistance. The a-Si area 2021 is set in the active layer 202, which is equivalent to that a large resistor is connected in series in a middle of a channel, and then the leakage current is reduced. Generally, the p-Si area 2022 is formed by performing laser radiation on partial areas in the channel. When the effective spot length of the laser is relatively small, the laser radiation may be performed on multiple areas to form multiple p-Si areas 2022. The width and length of the channel is not limited by the effective spot length and the technical complexity of the large-channel TFT is reduced.

Each a-Si area 2021 and p-Si area 2022 may be arranged in any order as long as the active layer 202 has the a-Si area 2021 and p-Si area 2022.

Further, when the active layer includes one a-Si area 2021, it is preferred to set the a-Si area 2021 in the center of the active layer. When the active layer includes at least two a-Si areas 2021, it is preferred to symmetrically set the a-Si areas 2021 in relative to a central axis between the source 203 and the drain 204.

Since the a-Si areas 2021 are symmetrically set in relative to the central axis between the source 203 and the drain 204, the generated electric fields are symmetric when the TFT is used. Therefore, the stability of the TFT is improved.

Figure 3:
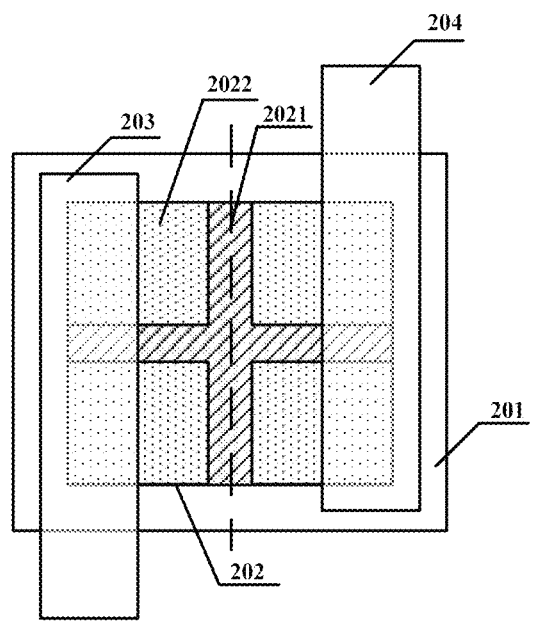
FIGS. 3 to 8 are top views of structure of a TFT in accordance with embodiments of the present disclosure.
Figure 4:
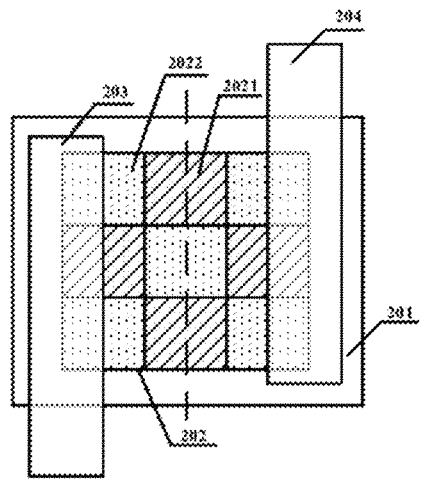

As shown in FIG. 3 and FIG. 4, the a-Si areas 2021 are symmetrically set in relative to the central axis between the source 203 and the drain 204. The dotted line shown in FIG. 3 and FIG. 4 is the central axis between the source 203 and drain 204.

Figure 5:
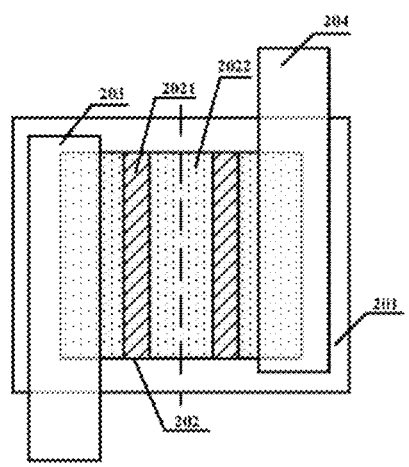

Each a-Si area 2021 and p-Si area 2922 are set in series in the active layer 202, as shown in FIG. 5. Then, a width of each a-Si area 2021 and p-Si area 2022 is equal to that of the active layer 202. Since each a-Si area 2021 and p-Si area 2022 are connected in series, this may effectively reduce the leakage current of the active layer 202. Meanwhile, since the structure of the active layer 202 is relatively simple, the effect is controllable.

Figure 6:
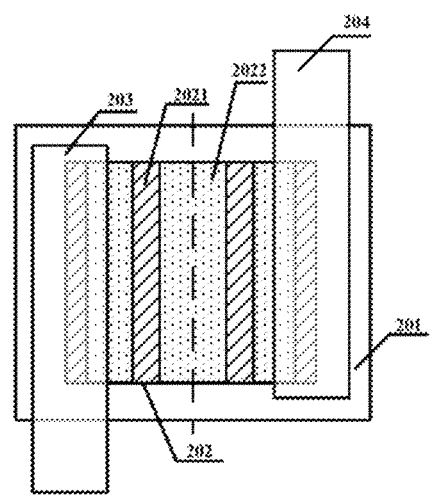
Figure 7:
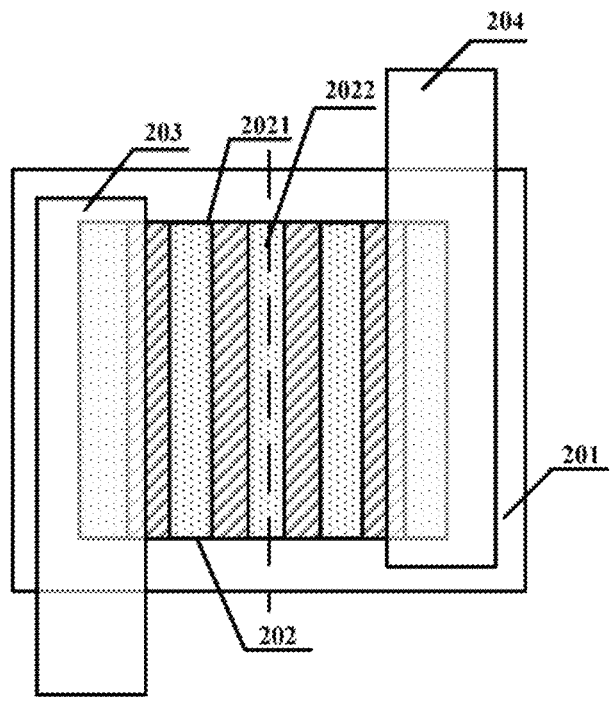
Figure 8:
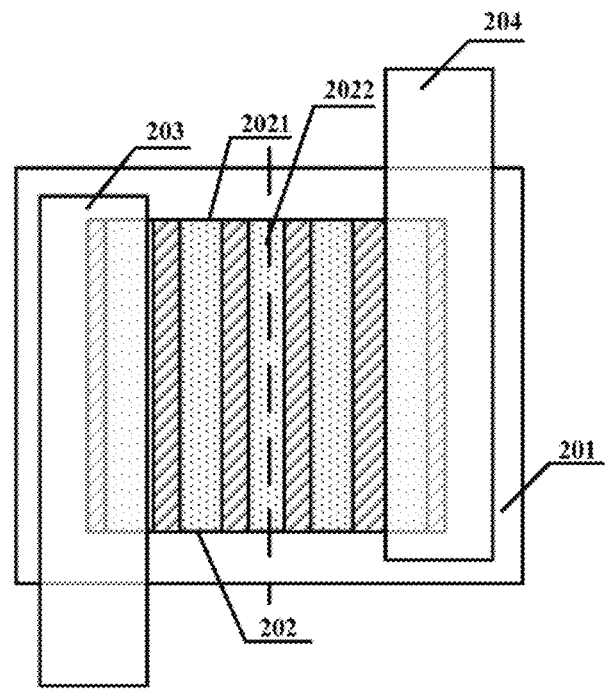

Preferably, as shown in FIG. 5, the active layer 202 may include 2 a-Si areas 2021 and 3 p-Si areas 2022; or, as shown in FIG. 6, the active layer 202 may include 4 a-Si areas 2021 and 3 p-Si areas 2022; or, as shown in FIG. 7, the active layer 202 may include 4 a-Si areas 2021 and 5 p-Si areas 2022; or, as shown in FIG. 8, the active layer 202 may include 6 a-Si areas 2021 and 5 p-Si areas 2022.

In some embodiments of the present disclosure, the dielectric layer 201 may be a gate insulating layer in the bottom-gate structure, or may be a buffer layer in the top-gate structure. When the TFT is that of the bottom-gate structure, as shown in FIG. 2, the dielectric layer 201 is a gate insulating layer.

The TFT further includes: a silicon oxide layer 205 set on the active layer 202 and a heavily-doped amorphous silicon layer 206 directly set on the silicon oxide layer 205.

The silicon oxide layer 205 may be silica materials or poly-silicon oxide materials.

The heavily-doped amorphous silicon layer 206 may be a heavily-doped amorphous silicon layer of an electron conduction type (N+) or a heavily-doped amorphous silicon layer of a hole conduction type (P+).

It can be seen that it is no longer needed to set a second a-Si layer on the silicon oxide layer 205. The heavily-doped amorphous silicon layer 206 may be directly set, which reduces the production process of the second a-Si layer and then reduces the technical complexity.

Figure 9:
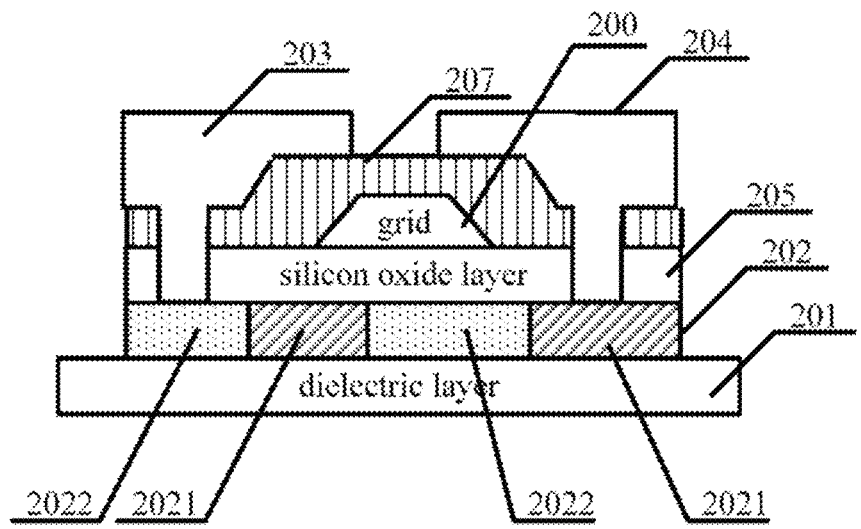
FIG. 9 is a diagram illustrating structure of a TFT with top gate structure in accordance with embodiments of the present disclosure.

Similarly, as for the TFT of the top-gate structure, it is no longer needed to set the second a-Si layer, which reduces the production process of the second a-Si layer and then reduces the technical complexity. As shown in FIG. 9, in the TFT of the top-gate structure, the TFT includes: a gate electrode 200, a source 203, a drain 204, a dielectric layer 201 and an active layer 202 set on the dielectric layer 201. The active layer 202 includes at least one a-Si area 2021 and at least one p-Si area 2022. The TFT further includes: a silicon oxide layer 205 set on the active layer 202. The gate electrode 200 is set on the silicon oxide layer 205 and the dielectric layer 207 is set on the gate electrode. The source 203 and drain 204 are connected to the active layer 202 through via holes.

Further, generally, the p-Si area 2022 is formed by performing laser radiation on partial areas in the channel. When the effective spot length of the laser is relatively small, the laser radiation may be performed on multiple areas to form multiple p-Si areas 2022. Generally, the effective spot is a rectangle, each side of which is less than 1000 micrometers. Therefore, it is preferred to set each side of each p-Si area as being less than or equal to 1000 micrometers. In order to ensure better serial effect, each side of each p-Si area and a-Si area is larger than or equal to 2 micrometers. Therefore, each side of each p-Si area is in a range of 2 micrometers to 1000 micrometers. It is preferred to set each side of the a-Si area as being larger than or equal to 2 micrometers.

Since each side of each p-Si area is in a range of 2 micrometers to 1000 micrometers and the length of each side of the each p-Si area is less than that of the side of the effective spot of ordinary laser, it is convenient for mass production of the TFT. Multiple p-Si and a-Si areas are connected in series and arranged alternately to make a TFT of arbitrary length and width. The length and width of the TFT Channel is no longer limited by the length of the effective spot. Therefore, the W/L (Width/Length) of the channel is no longer limited by the length of the effective spot of the laser and the TFT of a W/L may be made.

Figure 10:
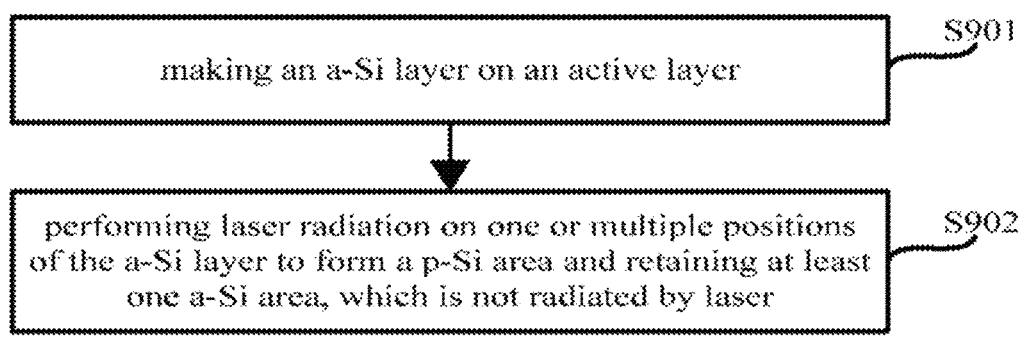
FIG. 10 is a flow chart illustrating a method for making a TFT in accordance with embodiments of the present disclosure.

Some embodiments of the present disclosure further provide a method for making a thin film transistor (TFT). As shown in FIG. 10, the method includes: block S901 of making an a-Si layer on an active layer; and block S902 of performing laser radiation on one or multiple positions of the a-Si layer to form a p-Si area and retaining at least one a-Si area, which is not radiated by laser.

Further, when one a-Si area, which is not radiated by laser, is retained, the a-Si area is set at the center of the active layer.

When at least two a-Si areas, which are not radiated by laser, are retained, the a-Si areas are symmetrically set in relative to a central axis between the source and the drain.

Since the a-Si areas are symmetrically set in relative to the central axis between the source and the drain, the generated electric field are symmetric when the TFT is used. Therefore, the stability of the TFT is improved.

As Shown in FIG. 3 and FIG. 4, the a-Si areas are symmetrically set in relative to the central axis between the source and the drain.

Further, each a-Si area and p-Si area are set in series in the active layer, that is, the width of each a-Si area and p-Si area is equal to that of the active layer.

Specifically, the block 902 of performing laser radiation on one or multiple positions of the a-Si layer to form a p-Si area and retaining at least one a-Si area, which is not radiated by laser, specifically includes: performing the laser radiation on 3 positions of the a-Si layer to form the p-Si area with 2 or 4 a-Si areas which are not radiated by the laser, are retained and form the TFT shown in FIG. 5 or FIG. 6; or, performing the laser radiation on 5 positions of the a-Si layer to form the p-Si area with 4 or 6 a-Si areas which are not radiated by the laser, are retained and form the active layer structure shown in FIG. 7 or FIG. 8.

In some embodiments of the present disclosure, the dielectric layer may be a gate insulating layer of the bottom-gate structure, or may be a buffer layer of the top-gate structure. When the TFT is that of the bottom-gate structure, the dielectric layer is a gate insulating layer. Then, at the block S902, after performing laser radiation on one or multiple positions of the a-Si layer to form a p-Si area and retaining at least one a-Si area, which is not radiated by laser, the method further includes: making a silicon oxide layer; directly making a heavily-doped amorphous silicon layer on the silicon oxide layer.

The TFT shown in FIG. 2 may be formed through the above blocks. The silicon oxide layer 205 may be silica materials or poly-silicon oxide materials.

The heavily-doped amorphous silicon layer 206 may be a heavily-doped amorphous silicon layer of an electron conduction type (N+) or a heavily-doped amorphous silicon layer of a hole conduction type (P+).

Generally, after the heavily-doped amorphous silicon layer is made, the SD layer is made on the heavily-doped amorphous silicon layer.

Similarly, as for the TFT of the top-gate structure, it is no longer needed to set the second a-Si layer, which reduces the production process of the second a-Si layer and then reduces the technical complexity.

It can be seen that it is no longer needed to make a second a-Si layer after the silicon oxide layer is made. The heavily-doped amorphous silicon layer may be directly made, which reduces the production process of the second a-Si layer and then reduces the technical complexity.

Preferably, the length of each side of the p-Si area is in a range of from 2 micrometers to 1000 micrometers; and the length of each side of each a-Si area is larger than or equal to 2 micrometers.

Since each side of each p-Si area is in a range of 2 micrometers to 1000 micrometers and the length of each side of the each p-Si area is less than that of the side of the effective spot of the common laser, it is convenient for mass production of the TFT. Multiple p-Si and a-Si areas are connected in series and arranged alternately to make a TFT of any length and width. The length and width of the TFT channel is no longer limited by the length of the effective spot. Therefore, the W/L (width/length) of the channel is no longer limited by the length of the effective spot of the laser and the TFT of any may be made.

Some embodiments of the present disclosure further provide a back plate that includes the TFT provided by some embodiments of the present disclosure.

Some embodiments of the present disclosure further provide a display device that includes the TFT provided by some embodiments of the present disclosure.

According to the method for making the TFT, the TFT, the back plate and the display device provided in some embodiments of the present disclosure provide, the active layer is set on the dielectric layer of the TFT, and the active layer includes at least one a-Si area and at least one p-Si area. In the active layer, the p-Si has large mobility rate and less defects, while the a-Si has many defects, strong resistance to electrons and large resistance. The presence of the a-Si area and p-Si area in the active layer is equivalent to that a large resistor is connected in series in the middle of the channel, and then the leakage current is reduced. Generally, the p-Si area is formed by performing laser radiation on partial areas in the channel. When the effective spot length of the laser is relatively small, the laser radiation may be performed on multiple areas to form multiple p-Si areas. The width and length of the channel is not limited by the effective spot length and the technical complexity of the large-channel TFT is reduced.

The above description is only used for describing optional embodiments and the principle of the applied technology. It should be understood by those skilled in the art of present application that the disclosed scope in the present application is not limited to technical scheme formed by specific combinations of the above technical characteristics, but also covers other technical solutions formed by any combination of the above technical characteristics or their equivalent characteristics without departing from the idea of the present disclosure, such as the technical solutions which are formed by replacing the above characteristics with those having similar functions to those technical characteristics disclosed in the present application (hut not limited to).

What is claimed is:

1. A thin film transistor (TFT), comprising:
   a gate electrode;
   a source;
   a drain;
   a dielectric layer, wherein the dielectric layer is a buffer layer; and
   an active layer on the dielectric layer, wherein the active layer includes at least one a-Si area and at least one p-Si area;

a silicon oxide layer on the active layer; and
a gate insulating layer on the gate electrode and between the silicon oxide layer and each of the source and the drain.

2. The TFT according to claim 1, wherein the active layer includes one a-Si area and the a-Si area is at a center of the active layer.

3. The TFT according to claim 1, wherein the active layer includes at least two a-Si areas and the a-Si areas are symmetrically set relative to a central axis between the source and the drain.

4. The TFT according to claim 1, wherein each a-Si area and each p-Si area in the active layer are set in series.

5. The TFT according to claim 4, wherein the active layer includes: 2 or 4 a-Si areas and 3 p-Si areas; or,
the active layer includes: 4 or 6 a-Si areas and 5 p-Si areas.

6. The TFT according to claim 1, wherein a length of each side of each p-Si area is in a range of from 2 micrometers to 1000 micrometers; and a length of each side of each a-Si area is larger than or equal to 2 micrometers.

7. The TFT according to claim 1, wherein there is an a-Si area between the source and the drain, and the a-Si area between the source and the drain is cross-shaped.

8. The TFT according to claim 7, wherein there are a plurality of p-Si areas between the source and the drain, and the plurality of p-Si areas between the source and the drain are disposed around the a-Si area between the source and the drain.

9. The TFT according to claim 1, wherein there are a plurality of a-Si areas between the source and the drain, and there are a plurality of p-Si areas between the source and the drain.

10. The TFT according to claim 9, wherein the plurality of a-Si areas between the source and the drain and the plurality of p-Si areas between the source and the drain are alternately arranged in a first direction from the source to the drain.

11. The TFT according to claim 10, wherein the plurality of a-Si areas between the source and the drain and the plurality of p-Si areas between the source and the drain are alternately arranged in a second direction which is perpendicular to the first direction.

12. A method for making the thin film transistor (TFT) according to claim 1, comprising:
making an a-Si layer on a dielectric layer;
performing laser radiation on one or multiple positions of the a-Si layer to form a p-Si area and retaining at least one a-Si area, which is not radiated by laser.

13. The method according to claim 12, wherein one a-Si area, which is not radiated by laser, is retained at a center of an active layer.

14. The method according to claim 12, wherein at least two a-Si areas, which are not radiated by laser, are retained and symmetrically set relative to a central axis between a source and a drain.

15. The method according to claim 12, wherein each a-Si area and each p-Si area in an active layer are set in series.

16. The method according to claim 15, wherein the performing laser radiation on one or multiple positions of the a-Si layer to form a p-Si area and retaining at least one a-Si area, which is not radiated by laser, comprises:
performing the laser radiation on 3 positions of the a-Si layer to form the p-Si areas and retaining 2 or 4 a-Si areas, which are not radiated by the laser, or,
performing the laser radiation on 5 positions of the a-Si layer to form the p-Si areas and retaining 4 or 6 a-Si areas, which are not radiated by the laser.

17. The method according to claim 12, wherein a length of each side of each p-Si area is in a range of from 2 micrometers to 1000 micrometers; and a length of each side of each a-Si area is larger than or equal to 2 micrometers.

18. A back plate, comprising: the TFT according to claim 1.

19. A display device, comprising: the TFT according to claim 1.

* * * * *